United States Patent
Ho et al.

(10) Patent No.: US 9,490,778 B1
(45) Date of Patent: Nov. 8, 2016

(54) HIGH-RESOLUTION OSCILLATOR HAVING WIDE FREQUENCY RANGE

(71) Applicant: Lattice Semiconductor Corporation, Hillsboro, OR (US)

(72) Inventors: Vinh Ho, Milpitas, CA (US); Magathi Jayaram, San Jose, CA (US); Hamid Ghezel, Santa Cruz, CA (US); David Li, San Jose, CA (US)

(73) Assignee: LATTICE SEMICONDUCTOR CORPORATION, Portland, OR (US)

( * ) Notice: Subject to any disclaimer, the term of this patent is extended or adjusted under 35 U.S.C. 154(b) by 0 days.

(21) Appl. No.: 14/797,206

(22) Filed: Jul. 13, 2015

(51) Int. Cl.
*H03K 3/03* (2006.01)
*H03K 3/012* (2006.01)

(52) U.S. Cl.
CPC ............ *H03K 3/0315* (2013.01); *H03K 3/012* (2013.01)

(58) Field of Classification Search
CPC .......................... H03K 3/0315; H03K 3/0322
USPC ............................ 331/57, 182, 183, 185, 186
See application file for complete search history.

(56) References Cited

U.S. PATENT DOCUMENTS

| | | | | |
|---|---|---|---|---|
| 7,126,431 B2* | 10/2006 | Mintchev | ............. | H03H 11/265 327/246 |
| 7,863,991 B1 | 1/2011 | Iravani | | |
| 9,000,857 B2* | 4/2015 | Lahiri | ..................... | H03L 7/085 327/541 |
| 9,007,140 B1* | 4/2015 | Kose | ........................ | H03K 7/08 331/185 |
| 2005/0046497 A1* | 3/2005 | Nakanishi | ............ | H03K 3/0315 331/57 |
| 2005/0057315 A1* | 3/2005 | Groen | .................. | H03K 3/0322 331/57 |
| 2006/0009184 A1* | 1/2006 | Goldman | ................ | H03L 7/093 455/260 |
| 2008/0002801 A1* | 1/2008 | Droege | ................ | H03D 13/002 375/375 |
| 2013/0229238 A1 | 9/2013 | Wadhwa | | |

* cited by examiner

*Primary Examiner* — Jeffrey Shin

(57) ABSTRACT

In one embodiment, a voltage-controlled oscillator has a ring of delay stages and power-regulating circuitry regulating power to each delay stage. Each delay stage has at least one inverter having a leg having a current regulator that controls current flowing through the leg and thereby controlling gain of the delay stage. The VCO receives three control signals that affect the amount of delay applied by each delay stage and therefore the VCO output frequency: a first applied to control the power-regulating circuitry, a second applied to at least one transistor gate in the current regulator, and a third applied to at least one transistor body in the current regulator. The power-regulating circuitry has a parallel configuration of a power-regulating transistor, a first capacitor, and a switched-capacitor leg having a second capacitor and a switch for controlling settling time. The capacitors regulate the power supply without a dedicated, opamp-based voltage regulator.

16 Claims, 4 Drawing Sheets

100

102

HIGH-RESOLUTION OSCILLATOR HAVING WIDE FREQUENCY RANGE

BACKGROUND

Field of the Invention

The present invention relates to electronics and, more specifically, to voltage-controlled oscillators.

Description of the Related Art

This section introduces aspects that may help facilitate a better understanding of the invention. Accordingly, the statements of this section are to be read in this light and are not to be understood as admissions about what is prior art or what is not prior art.

Voltage-controlled oscillators (VCOs) are widely used in the semiconductor industry, such as in transceivers for clock and data recovery (CDR) circuits and phase-locked loop (PLL) circuits. It is desirable for VCOs to have a wide tunable frequency range, for example, to support various communication protocols, while still maintaining low power, low noise, and low supply sensitivity.

A conventional VCO has a tunable output frequency that is a function of an input voltage or current. High-frequency VCOs that traditionally satisfy the low noise/jitter criteria specified by communication protocols are either power hungry or support only a narrow band of frequencies. For example, LC-tank VCOs can yield relatively low phase noise at high frequency, but have a narrow frequency range. On the other hand, high-frequency, wideband ring VCOs are power hungry and have difficulty meeting jitter budgets. In addition, ring VCOs characteristically have a dedicated, opamp-based regulator in order to provide low supply sensitivity, which further increases VCO power consumption.

SUMMARY

In one embodiment, an oscillator comprises a plurality of delay stages connected in a ring, wherein each delay stage is connected to apply a delay to an input signal received from a previous delay stage in the ring to generate a delayed output signal applied to a next delay stage in the ring. The oscillator is connected to receive a plurality of control signals that control magnitude of the delay applied by at least one delay stage. A first control signal is connected to control power supplied to the at least one delay stage, and a second control signal is connected to control gain within the at least one delay stage, where the magnitude of the delay applied by the at least one delay stage is a function of the first and second control signals.

Another embodiment is a method for controlling the oscillator. The method comprises (a) selecting an initial value for the first control signal to control the power supplied to the at least one delay stage; (b) selecting an initial value for the second control signal to control the gain with the at least one delay stage; and (c) adaptively updating at least one of the first and second control signals based on a phase difference between an oscillating output signal generated by the oscillator and a second signal.

In yet another embodiment, an oscillator comprises a plurality of delay stages connected in a ring, wherein each delay stage is connected to apply a delay to an input signal received from a previous delay stage in the ring to generate a delayed output signal applied to a next delay stage in the ring. Power-control circuitry controls power supplied to at least one delay stage. The power-control circuitry is connected to regulate an applied power supply voltage without a dedicated, opamp-based voltage regulator, where magnitude of the delay applied by the at least one delay stage is a function of the power supplied to the at least one delay stage.

BRIEF DESCRIPTION OF THE DRAWINGS

Embodiments of the invention will become more fully apparent from the following detailed description, the appended claims, and the accompanying drawings in which like reference numerals identify similar or identical elements.

DETAILED DESCRIPTION

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1:
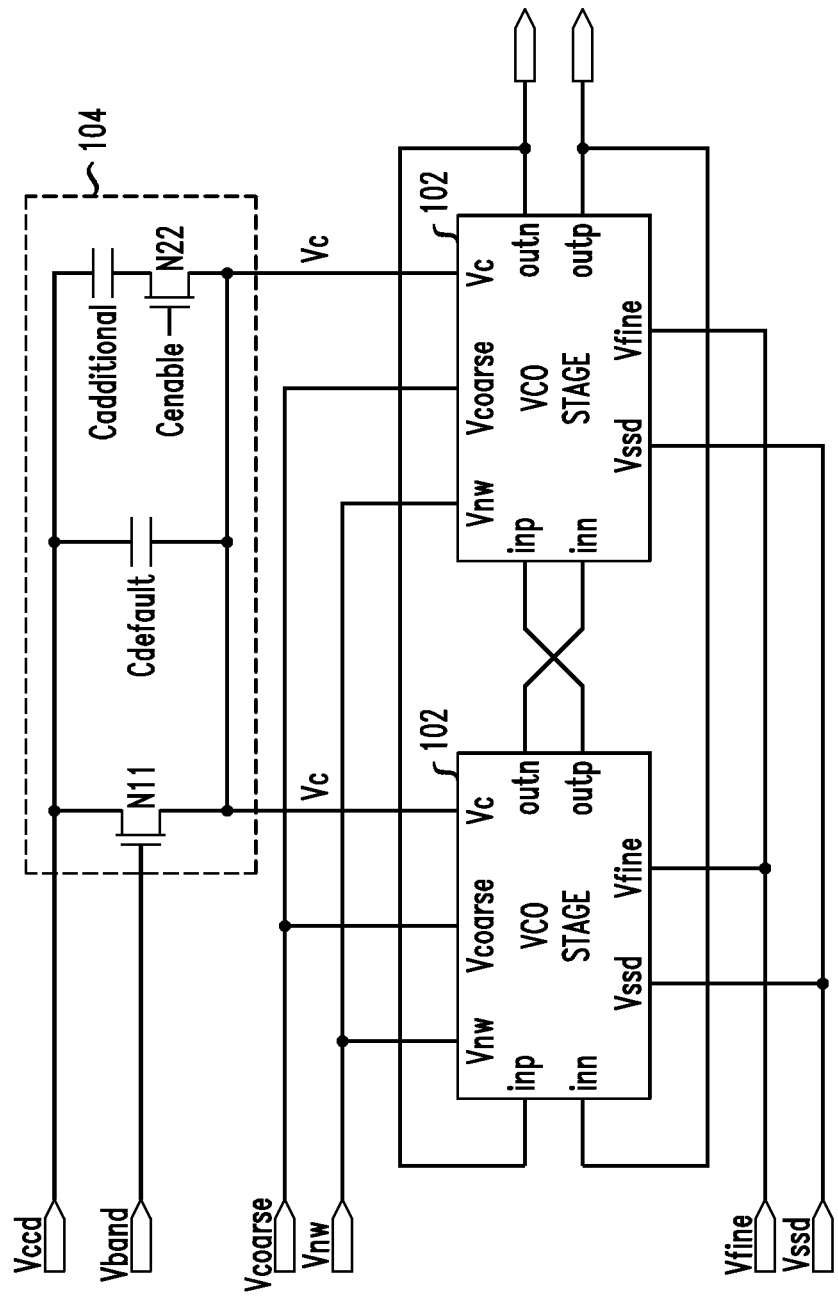
FIG. 1 is a schematic block diagram of an exemplary voltage-controlled oscillator (VCO) according to one embodiment of the disclosure.

FIG. 1 is a schematic block diagram of an exemplary ring voltage-controlled oscillator (VCO) 100 according to one embodiment of the disclosure. VCO 100 comprises a plurality of delay stages 102 connected in a ring configuration to automatically resonate and generate an oscillating differential output signal outp, outn whose frequency is a function of three different VCO control signals applied to VCO 100: Vband, Vcoarse, and Vfine. Although VCO 100 has only two delay stages 102, those skilled in the art will understand that VCOs of the disclosure can have any suitable number of delay stages 102 connected to form a ring. VCO 100 also includes power-control circuitry 104, which converts the power supply voltage Vccd into the operating voltage Vc that applies operating power to each delay stage 102 based on (i) the VCO control signal Vband and (ii) the switch control signal Cenable. Power-control circuitry 104, which will be described in further detail below, regulates the supply voltage Vccd without requiring provisioning of a dedicated, opamp-based voltage regulator.

Figure 2:
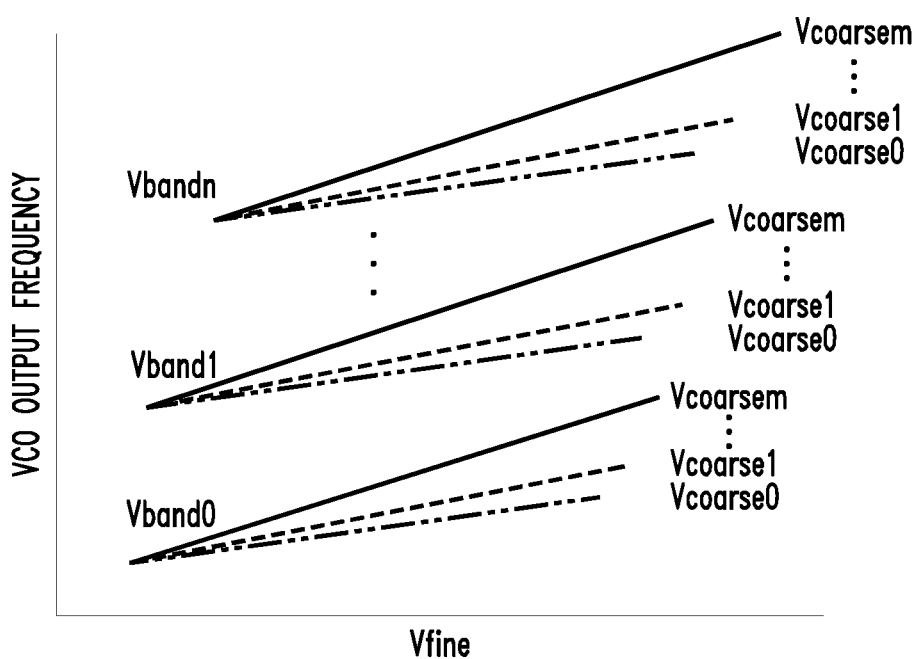
FIG. 2 is a graphical representation of the frequency of the output signal of the VCO of FIG. 1 for different combinations of the VCO control signals Vband, Vcoarse, and Vfine.

FIG. 2 is a graphical representation of the frequency of the output signal of VCO 100 of FIG. 1 for different combinations of the VCO control signals Vband, Vcoarse, and Vfine, where:

Vband controls the selection of one of a plurality of different available frequency bands for the VCO output signal, where FIG. 2 represents n different frequency bands Vband0, Vband1, . . . , Vbandn, where each frequency band includes a plurality of differently sloped frequency curves;

Vcoarse controls the selection of a corresponding frequency curve within the corresponding frequency band selected by Vband, where FIG. 2 represents m different frequency curves Vcoarse0, Vcoarse1, . . . , Vcoarsem for each different frequency band; and Vfine controls the selection of a location along the corresponding frequency curve selected by Vcoarse within the corresponding frequency band selected by Vband.

In certain implementations of VCO 100 of FIG. 1, each of control signals Vband, Vcoarse, and Vfine are analog voltages generated by a digital controller (not shown) that can generate a limited number of different voltage levels for each control signal. In such implementations, the curves of FIG. 2 are really just collections of a finite set of points, where each different point in the graph represents a unique combination of the three control signals. For a typical implementation of VCO 100, the differences between consecutive values of each of Vband, Vcoarse, and Vfine result in that collection of points effectively forming the different frequency bands of FIG. 2, where each band contains a number of differently sloped frequency curves. In such implementations, Vband functions as a coarsest-resolution control signal, Vcoarse functions as a mid-resolution control signal, and Vfine functions as a finest-resolution control signal. Note that the curves shown in FIG. 2 are for purposes of illustration and are not intended as a limiting or exact representation of the relationships between Vband, Vcoarse, and Vfine and the VCO output frequency for all implementations of the invention.

Figure 3:
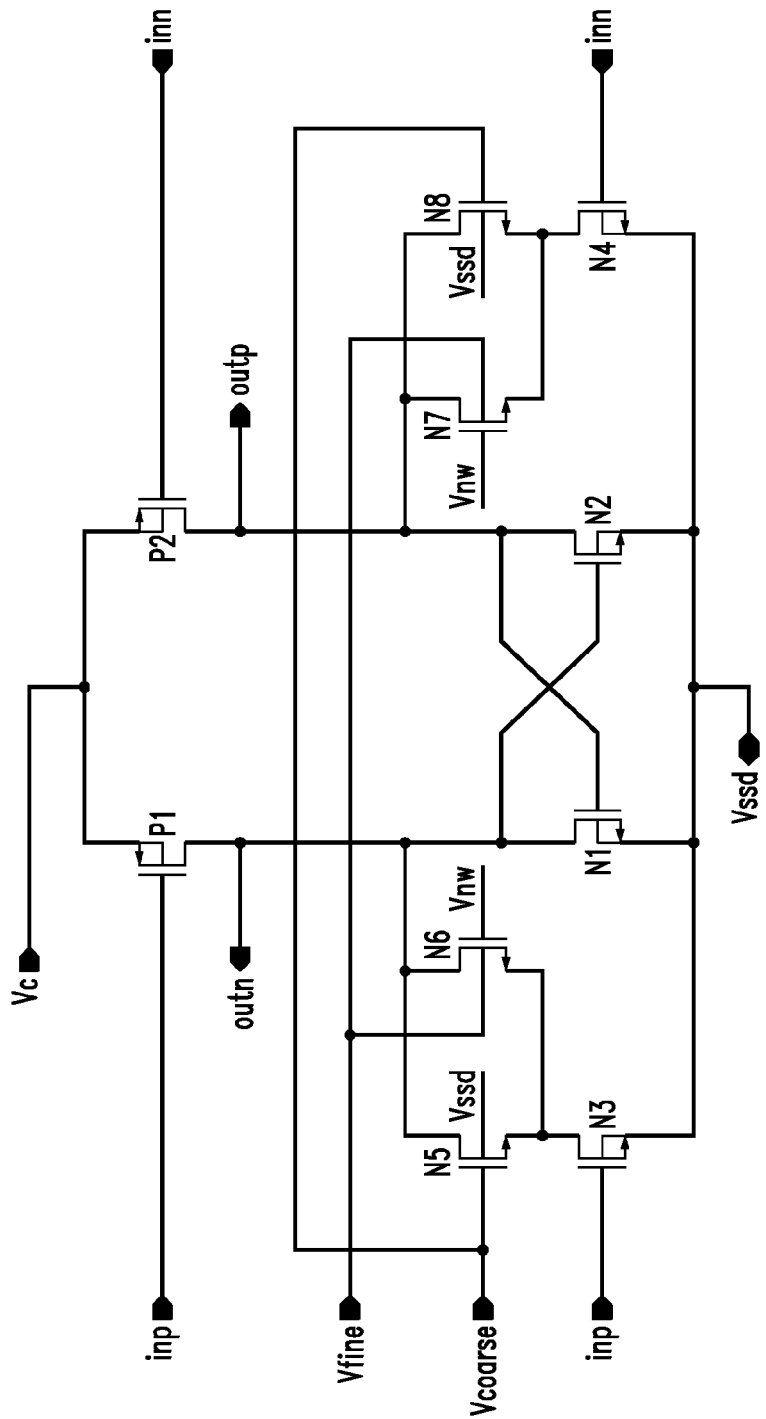
FIG. 3 is a schematic transistor-level diagram of circuitry that can be used to implement each delay stage of the VCO of FIG. 1.

FIG. 3 is a schematic transistor-level diagram of circuitry that can be used to implement each delay stage 102 of FIG. 1. Delay stage 102 receives a differential input signal inp, inn from the previous delay stage in the VCO ring and generates a delayed, differential output signal outp, outn that is applied to the next delay stage in the VCO ring. Delay stage 102 comprises two p-type (e.g., PMOS) transistors P1 and P2 and six n-type (e.g., NMOS) transistors N1-N8. Transistors P1-P2 and N1-N4 are connected to form two cross-connected inverters as in a conventional VCO delay stage. The operating voltage Vc is applied to the sources of transistors P1 and P2, as in a conventional VCO delay stage. Transistors N5-N6 are connected to form a first current regulator that regulates the amount of current available to pass through transistor N3. Similarly, transistors N7-N8 are connected to form a second current regulator that controls the amount of current available to pass through transistor N4. Those skilled in the art will understand that there are other ways to implement current regulators, such as using a single transistor for each current regulator.

Transistors N1-N8 are triple-well, n-type devices in which:

The voltage Vssd is applied to the p-substrate connection of each device and to the bodies (also known as the tubs or the bulks) of transistors N1-N5 and N8;

The voltage Vnw is applied to the deep n-well connection of each device and to the gates of transistors N6 and N7;

The control signal Vfine is applied to the bodies of transistors N6-N7; and

The control signal Vcoarse is applied to the gates of transistors N5 and N8.

Transistors P1 and P2 are p-type devices with substrate ties.

Each of the three control signals Vband, Vfine, and Vcoarse affects the magnitude of the propagation delay applied by delay stage 102 to the received differential input signal inp, inn in generating the delayed differential output signal outp, outn. The greater the propagation delay, the lower the frequency of oscillation of the VCO output signal. Increasing the control signal Vband, which increases the operating voltage Vc, decreases the propagation delay of delay stage 102 and therefore increases the frequency of the VCO output signal.

With respect to the control signal Vcoarse, increasing Vcoarse turns transistors N5-N8 on more, which increases the current available to flow through transistors N3 and N4, which decreases the capacitive load seen by the delay-stage output nodes and therefore increases the gain of delay stage 102. As such, increasing Vcoarse decreases the propagation delay of delay stage 102 and therefore increases the frequency of the VCO output signal.

With respect to the control signal Vfine, increasing Vfine increases the body voltage of transistors N6 and N7, thereby changing the threshold voltage of transistors N6 and N7. Thus, increasing Vfine decreases the propagation delay of delay stage 102 and therefore increases the frequency of the VCO output signal.

Note that increasing Vcoarse and/or increasing Vfine will result in a smaller capacitive load at the delay-stage output nodes, a higher delay-stage gain, and a higher frequency of the VCO output signal, but will cause a larger phase noise (flicker, thermal) due to the smaller time available for the delay-stage output nodes to charge and discharge. Thus, a higher gain will cause more phase noise, while a lower gain will reduce the phase noise and improve the jitter performance. As evidenced in FIG. 2, the available values for the control signals Vband, Vcoarse, and Vfine can be designed to provide significant overlap between the frequency ranges available in different frequency bands, as well as between different frequency curves within each frequency band. Depending on the target frequency, the VCO can be configured to yield the best available noise/jitter performance at that target frequency.

Figure 4:
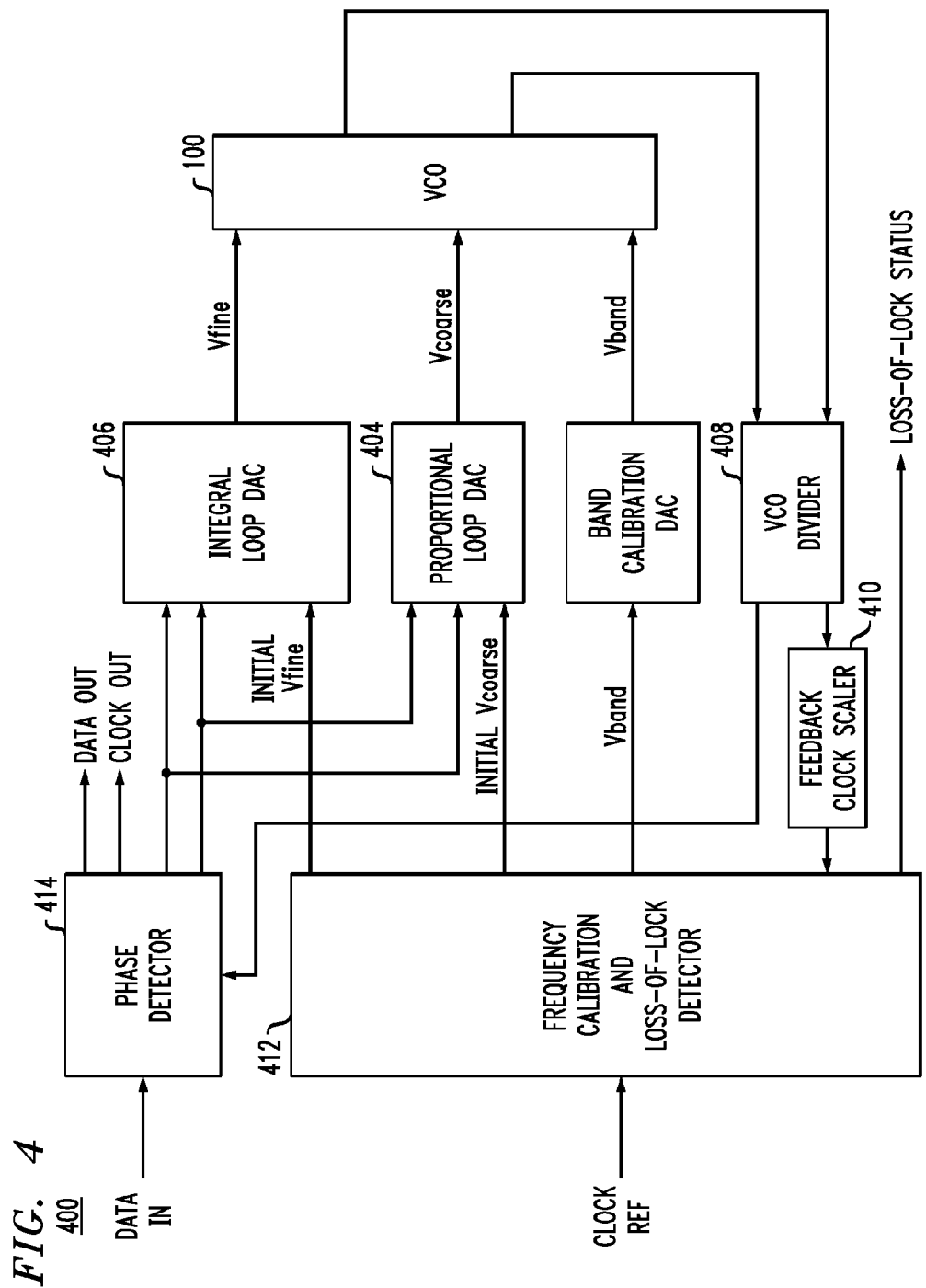
FIG. 4 is a block diagram of one possible application of the VCO of FIG. 1 in a dual-loop clock-and-date recovery (CDR) circuit.

FIG. 4 is a block diagram of one possible application of the VCO 100 of FIG. 1 in a dual-loop clock-and-date recovery (CDR) circuit 400 that recovers digital clock and data signals CLOCK OUT and DATA OUT from a received differential input data signal DATA IN. As shown in FIG. 4, VCO 100 receives the control signal Vband from a band calibration digital-to-analog converter (DAC) 402, the control signal Vcoarse from a proportional loop DAC 404, and the control signal Vfine from an integral loop DAC 406.

The differential output clock VCO OUT generated by the VCO 100 is fed back through a VCO divider 408 and a feedback clock scaler 410 to a frequency calibration and loss-of-lock detector circuit 412, which (i) performs an initial off-line calibration procedure at startup to set the initial values of Vband, Vcoarse, and Vfine and (ii) monitors the subsequent on-line operations of the CDR circuit 400 for loss-of-lock status. During the calibration procedure, the calibration circuit 412 uses a received reference clock CLOCK REF to traverse through different values of Vband to find the best band for locking the feedback clock to the reference clock as well as initial values for Vcoarse and Vfine. As shown in FIG. 2, there may be overlap between the VCO output frequencies that can be achieved using different values of Vband. Similarly, there is also overlap between the VCO output frequencies that can be achieved using different values of Vcoarse for a given value of Vband.

In one possible implementation, the initial calibration procedure selects the value of Vband based on the first band with a specified maximum desired difference between the frequency of the reference clock CLOCK REF and the frequency of the feedback clock from the feedback clock scaler 410. For example, if 200 ppm is selected as the maximum desired frequency difference, then the initial calibration procedure will find the first band that satisfies this criterion (i.e., reference clock frequency-feedback clock frequency <=200 ppm). In another possible implementation, the initial calibration procedure selects the value Vband based on the band having the minimum difference between these two frequencies. In either case, the CDR circuit 400 is designed such that, for a particular protocol, the value of Vband will not need to be changed over different PVT conditions, and only the values of Vcoarse and Vfine are adaptively updated by the corresponding control loops.

The feedback clock generated by the VCO divider 410 is also fed back to a phase detector 414, which compares the feedback clock to the differential input data signal DATA IN to generate (i) the on-line adjustments to Vcoarse (by the proportional loop of the dual-loop CDR circuit 100) and Vfine (by the integral loop) as well as (ii) the CDR circuit's clock and data output signals CLOCK OUT and DATA OUT. In this exemplary application, Vband is selected during the initial calibration and not updated until the system is re-calibrated.

Returning again to FIG. 1, power-control circuitry 104 comprises n-type (e.g., NMOS) transistors N11 and N22 and capacitors Cdefault and Cadditional. Power-regulating transistor N11 is similar to the corresponding power-regulating transistors of conventional VCOs that regulate what fraction of the supply voltage Vccd gets applied as the operating voltage Vc to power the delay stages 102.

In a conventional VCO, a dedicated, opamp-based voltage regulator is provided to regulate the power supply voltage Vccd. Instead of providing a dedicated, opamp-based voltage regulator, power-control circuitry 104 relies on passive capacitance to attenuate power supply noise and thereby regulate the supply voltage Vccd. In general, the larger the capacitance, the better the supply voltage regulation. Unfortunately, larger capacitance can cause a VCO used in a PLL or CDR circuit to have lengthy settling times since the larger capacitor will have an extended charging interval. In order to address this problem, power-control circuitry 104 has a relatively small capacitor Cdefault connected in parallel with a switched-capacitor leg formed by a relatively large capacitor connected in series with switch device N22.

During startup of VCO 100, the switch control signal Cenable is de-asserted (i.e., driven low by a controller (not shown)) such that switch device N22 is off, and the effective capacitance of power-control circuitry 104 is based on the relatively small Cdefault and independent of Cadditional so that VCO 100 will have a relatively short settling time. When the PLL/CDR circuit is close to locking, the switch control signal Cenable is asserted (i.e., driven high) such that switch device N22 is on, and the effective capacitance of power-control circuitry 104 will be based on the combination of the relatively small Cdefault and the relatively large Cadditional so that each delay stage 102 will operate with a well-regulated supply voltage Vccd.

For example, when VCO 100 is used in a CDR circuit, the CDR start-up sequence causes the CDR loop to initially lock to the reference clock. Once the loop is locked to the reference frequency, the loop switches to the data path, where the CDR tracks the data signal to generate the correcting signals needed to achieve and maintain phase lock with the data. The CDR calibration circuit causes the loop to initially lock to the reference clock by calibrating the correct band as well as a coarse tuning band. When this calibration is complete, the CDR calibration circuit sends out status flags (including Cenable) indicating that the CDR is ready to switch to the data loop. The control signal Cenable is used to enable the additional capacitor Cadditional, so that the capacitance of this capacitor is applied only when the CDR loop is close to locking, thereby speeding up the settling time.

Although the invention has been described in the context of voltage-controlled oscillators, the invention can also be implemented in the context of current-controlled oscillators employing current mirrors to vary Vband, Vcoarse, and Vfine.

Although the invention has been described as being implemented using MOS technology, alternative implementations may use other technologies, such as silicon-on-insulator (SOI) technology, that enable triple-well architectures.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Signals and corresponding nodes, ports, or paths may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "channel node" refers generically to either the source or drain of a metal-oxide semiconductor (MOS) transistor device (also referred to as a MOSFET), the term "channel" refers to the path through the device between the source and the drain, and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi-polar device when an embodiment of the invention is implemented using bi-polar transistor technology.

Integrated circuits have become increasingly complex. Entire systems are constructed from diverse integrated circuit sub-systems. Describing such complex technical subject matter at an appropriate level of detail becomes necessary. In general, a hierarchy of concepts is applied to allow those of ordinary skill to focus on details of the matter being addressed.

Describing portions of a design (e.g., different functional units within an apparatus or system) according to functionality provided by those portions is often an appropriate level of abstraction, since each of these portions may themselves comprise hundreds of thousands, hundreds of millions, or more elements. When addressing some particular feature or implementation of a feature within such portion(s), it may be appropriate to identify substituent functions or otherwise characterize some sub-portion of that portion of the design in more detail, while abstracting other sub-portions or other functions.

A precise logical arrangement of the gates and interconnect (a netlist) implementing a portion of a design (e.g., a functional unit) can be specified. How such logical arrangement is physically realized in a particular chip (how that logic and interconnect is laid out in a particular design) may differ in different process technologies and/or for a variety of other reasons. Circuitry implementing particular functionality may be different in different contexts, and so disclosure of a particular circuit may not be the most helpful disclosure to a person of ordinary skill. Also, many details concerning implementations are often determined using design automation, proceeding from a high-level logical description of the feature or function to be implemented. In various cases, describing portions of an apparatus or system in terms of its functionality conveys structure to a person of ordinary skill in the art. As such, it is often unnecessary and/or unhelpful to provide more detail concerning a portion of a circuit design than to describe its functionality.

Functional modules or units may be composed of circuitry, where such circuitry may be fixed function, configurable under program control or under other configuration information, or some combination thereof. Functional modules themselves thus may be described by the functions that they perform, to helpfully abstract how some of the constituent portions of such functions may be implemented. In some situations, circuitry, units, and/or functional modules may be described partially in functional terms, and partially in structural terms. In some situations, the structural portion of such a description may be described in terms of a configuration applied to circuitry or to functional modules, or both.

Configurable circuitry is effectively circuitry or part of circuitry for each different operation that can be implemented by that circuitry, when configured to perform or otherwise interconnected to perform each different operation. Such configuration may come from or be based on instructions, microcode, one-time programming constructs, embedded memories storing configuration data, and so on. A unit or module for performing a function or functions refers, in some implementations, to a class or group of circuitry that implements the functions or functions attributed to that unit. Identification of circuitry performing one function does not mean that the same circuitry, or a portion thereof, cannot also perform other functions concurrently or serially.

Although circuitry or functional units may typically be implemented by electrical circuitry, and more particularly, by circuitry that primarily relies on transistors fabricated in a semiconductor, the disclosure is to be understood in relation to the technology being disclosed. For example, different physical processes may be used in circuitry implementing aspects of the disclosure, such as optical, nanotubes, micro-electrical mechanical elements, quantum switches or memory storage, magnetoresistive logic elements, and so on. Although a choice of technology used to construct circuitry or functional units according to the technology may change over time, this choice is an implementation decision to be made in accordance with the then-current state of technology.

Embodiments according to the disclosure include non-transitory machine readable media that store configuration data or instructions for causing a machine to execute, or for configuring a machine to execute, or for describing circuitry or machine structures (e.g., layout) that can execute or otherwise perform, a set of actions or accomplish a stated function, according to the disclosure. Such data can be according to hardware description languages, such as HDL or VHDL, in Register Transfer Language (RTL), or layout formats, such as GDSII, for example.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. An oscillator comprising a plurality of delay stages connected in a ring, wherein:
   each delay stage is connected to apply a delay to an input signal received from a previous delay stage in the ring to generate a delayed output signal applied to a next delay stage in the ring;
   each delay stage comprising cross-coupled inverters comprising respective NMOS transistors, first and second current regulators, each current regulator comprising at least one NMOS transistor formed in a triple-well process and having a body connection, a deep well connection, and a gate connection;

a first control signal is connected to control power supplied to the at least one delay stage;

a second control signal is electrically coupled with the body connection of the at least one NMOS transistor in the first and the second current regulators, wherein a voltage level of the second control signal affects an amount of current available to flow through respective NMOS transistors of the cross-coupled inverters, and the magnitude of the delay applied by the at least one delay stage is a function of the first and second control signals.

2. The oscillator of claim 1, further comprising a third control signal coupled with gates of the at least one NMOS transistor of the first and second current regulators wherein an increase in the voltage of the third control signal voltage level turns on the first and second current regulators more to decrease the capacitive load at the output node of the delay stage.

3. The oscillator of claim 1, wherein the oscillator is a voltage-controlled oscillator.

4. The oscillator of claim 1, further comprising power-control circuitry that is connected to control the power supplied to the at least one delay stage based on the first control signal, wherein the power-control circuitry is connected to regulate an applied power supply voltage without a dedicated, opamp-based voltage regulator.

5. The oscillator of claim 4, wherein the power-control circuitry comprises:

a power-regulating transistor connected between the power supply voltage and a power-supply node of the at least one delay stage, wherein the first control signal is connected to be applied to the gate of the power-regulating transistor; and at least a first capacitor connected in parallel with the power-regulating transistor.

6. The oscillator of claim 5, wherein:

the power-control circuitry further comprises a switched-capacitor leg connected in parallel with the power-regulating transistor and the first capacitor, wherein the switched-capacitor leg comprises a second capacitor connect in series with a switch;

when the switch is open, the capacitance of the power-control circuitry is based on the first capacitor and independent of the second capacitor; and when the switch is closed, the capacitance of the power-control circuitry is based on a combination of the first and second capacitors.

7. The oscillator of claim 6, wherein settling time of circuitry comprising the oscillator is shorter with the switch open than with the switch closed.

8. The oscillator of claim 1, wherein each delay stage comprises a differential input comprising a pair of P input nodes, and a pair of N input nodes, a differential output comprising a P output and an N output, wherein one node of each of the current regulators is respectively connected with either the P output or the N output of the differential output and one of the P input nodes and one of the N input nodes is coupled to a gate of a diode-connected transistor on a respective drain side of the NMOS transistors of the first and the second current regulators.

9. An oscillator comprising:

a plurality of delay stages connected in a ring, wherein each delay stage is connected to apply a delay to an input signal received from a previous delay stage in the ring to generate a delayed output signal applied to a next delay stage in the ring; and power-control circuitry that controls power supplied to at least one delay stage, wherein:

the power-control circuitry is connected to receive a band control signal that sets an applied power supply voltage, wherein the power control circuitry does not adjust the applied power supply voltage after an initial calibration process; and each of the delay stages is configured to receive, at current regulator elements, a first control signal generated by a proportional feedback path and a second variable control signal generated by an integral feedback path, to adjust delay in relatively coarse increments responsive to variation of the first control signal and relatively fine increments responsive to variation of the second control signal.

10. The oscillator of claim 9, wherein the oscillator is a voltage-controlled oscillator.

11. The oscillator of claim 9, wherein the power-control circuitry comprises:

a power-regulating transistor connected between the power supply voltage and a power-supply node of the at least one delay stage, wherein a control signal is connected to be applied to the gate of the power-regulating transistor; and at least a first capacitor connected in parallel with the power-regulating transistor.

12. The oscillator of claim 11, wherein:

the power-control circuitry further comprises a switched-capacitor leg connected in parallel with the power-regulating transistor and the first capacitor, wherein the switched-capacitor leg comprises a second capacitor connect in series with a switch;

when the switch is open, the capacitance of the power-control circuitry is based on the first capacitor and independent of the second capacitor; and when the switch is closed, the capacitance of the power-control circuitry is based on a combination of the first and second capacitors.

13. The oscillator of claim 12, wherein settling time of circuitry comprising the oscillator is shorter with the switch open than with the switch closed.

14. A method for controlling a voltage controlled oscillator comprising:

selecting an initial value for a first control signal to control a power supplied to a at least one delay stage of a plurality of delay stages in the oscillator to set a frequency band for locking a feedback clock to a reference clock;

selecting applying an initial value for the a second control signal to control a capacitive load on output nodes of the plurality of delay stages control the gain with the at least one delay stage; and applying a third control signal to bodies of NMOS transistors of current regulators that regulate current through legs of cross-coupled inverters in each delay stage, wherein values of the second and third control signals are adaptively updated based on a phase difference between an oscillating output signal generated by the oscillator and a second signal.

15. The method of claim 14, wherein:

the oscillating output signal has overlapping frequency ranges for different values of the first control signal; and selecting an initial value for the first control signal comprises selecting the initial value for the first control signal to enable the second control signal to be adaptively updated during operation of the oscillator without having to modify the first control signal.

16. The method of claim 14, wherein the phase difference is between the oscillating output signal and an input data signal.

\* \* \* \* \*